(12) United States Patent
Burns

(10) Patent No.: US 6,897,670 B2
(45) Date of Patent: May 24, 2005

(54) PARALLEL INTEGRATED CIRCUIT TEST APPARATUS AND TEST METHOD

(75) Inventor: Mark A. Burns, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 64 days.

(21) Appl. No.: 10/026,053

(22) Filed: Dec. 21, 2001

(65) Prior Publication Data

US 2003/0117161 A1 Jun. 26, 2003

(51) Int. Cl.$^7$ .............................................. G01R 31/02
(52) U.S. Cl. ..................... 324/758; 324/765; 324/158.1
(58) Field of Search ................. 324/754, 765, 324/158.1, 761, 758, 72.5, 755; 438/14, 17, 18; 257/48; 209/655; 414/421, 763; 702/108

(56) References Cited

U.S. PATENT DOCUMENTS

| | | | |
|---|---|---|---|
| 5,629,632 A | * 5/1997 | Tsutsumi | 324/758 |
| 6,275,052 B1 | 8/2001 | Hembree et al. | |
| 6,292,003 B1 | 9/2001 | Fredrickson et al. | |
| 6,297,654 B1 | 10/2001 | Barabi | |
| 6,304,073 B1 | 10/2001 | Saito | |
| 6,313,652 B1 | * 11/2001 | Maeng | 324/760 |
| 6,320,398 B1 | 11/2001 | Ito et al. | |
| 6,320,803 B1 | 11/2001 | Gall et al. | |
| 6,731,127 B2 | * 5/2004 | Watts | 324/765 |

OTHER PUBLICATIONS

Burns, Mark and Roberts, Gordon, "Focused Calibrations", An Introduction to Mixed–Signal IC Test and Measurement, Oct. 2000, pp. 369–401, ISBN 095140168, Oxford University Press, New York, New York.

* cited by examiner

Primary Examiner—David Zarneke
Assistant Examiner—Jimmy Nguyen
(74) Attorney, Agent, or Firm—Jacqueline J. Garner; Wade James Brady, III; Frederick J. Telecky, Jr.

(57) ABSTRACT

A test apparatus (400) comprising a single handler (404) is coupled to a first tester (436) and second tester (408), wherein the first (436) and second (408) testers are coupled together. A first test procedure is performed on a set of second IC's using the first tester (436), simultaneously while a second test procedure is performed on a first set of IC's using the second tester (408). Sets of IC's may be tested in parallel by a plurality of testers (436/408) within a single handler (404). The first (436) and second (408) testers may be coupled to a multiplexer (460) to allow the use of a single test head (478), which avoids having to make contact to the integrated circuit more than once, which is particularly advantageous in wafer probe testing.

6 Claims, 5 Drawing Sheets

PARALLEL INTEGRATED CIRCUIT TEST APPARATUS AND TEST METHOD

CROSS-REFERENCE TO RELATED APPLICATIONS

Embodiments of the present invention are related to commonly-assigned U.S. patent application, Ser. No. 10/026,085 filed Dec. 21, 2001 by Watts, entitled "Parallel Integrated Circuit Test Apparatus and Test Method," which is incorporated herein by reference.

TECHNICAL FIELD

This invention relates generally to the testing of integrated circuits, and more particularly to an apparatus and method for testing sets of integrated circuits simultaneously with two or more testers.

BACKGROUND

Semiconductors are widely used to manufacture integrated circuits for electronic applications, including computers, radios, televisions, digital cameras, and personal computing devices, as examples. Such integrated circuits typically include multiple transistors fabricated in single crystal silicon. For example, there may be millions of semiconductor devices manufactured on a single semiconductor product. With the trend towards downsizing electronic devices, there is a need to manufacture smaller integrated circuits and package the integrated circuits in smaller packages. The manufacturing and testing of downsized integrated circuits and packages presents many challenges.

Integrated circuits are typically manufactured by depositing a plurality of conductive, insulative, and/or semiconductive material layers on a semiconductor substrate, and patterning the various material layers using lithography processes to form devices and interconnects that perform the electrical functions of the integrated circuit. Usually, hundreds or thousands of integrated circuits are manufactured on a single semiconductor wafer. The wafer is then tested, by a wafer probe test, for example, which tests single integrated circuits (IC's) on the wafer at a time, or groups of single IC's at a time.

The integrated circuits that pass the wafer probe test are packaged after singulation. Packaging is typically required because the integrated circuits are too small to be electrically coupled directly to printed circuit boards. Although usually, a single integrated circuit is packaged in a single package, alternatively, a plurality of integrated circuits may be packaged in a single package, known as a hybrid IC.

Typically, an integrated circuit is packaged by attaching the device to a substrate or some other material more rigid than the integrated circuit wafer material, often with the package being larger than the integrated circuit. The IC package usually comprises a plurality of contact terminals that may be used to couple the packaged integrated circuit to a printed circuit board or other device, depending on the application.

An example of a prior art IC test apparatus 100 is shown in FIG. 1. Test apparatus 100 comprises a "high cost" test apparatus, referred to as "high cost" because of the high expense of the tester 108, and therefore, the high expense per IC of running tests on IC's. The high cost test apparatus 100 may cost hundreds of thousands to millions of dollars (U.S. $), for example, and maybe used to test packaged IC's.

The high cost test apparatus 100 includes an input station 102 coupled to a handler 104, with an output station 106 coupled to the handler 104 on the opposite side. The test apparatus 100 includes a tester 108 which is typically a high cost piece of equipment that includes control circuitry and test electronics, and includes storage for storing the IC test information obtained. The test apparatus 100 includes a monitor 138 and console 142 adapted to receive instructions from and provide information and communicate test results to an operator. The monitor 138 and console 142 may be integral to the tester 108 or handler 104, for example (not shown).

The test apparatus 100 includes a test head 110 that is coupled to the tester 108 by a cable or wiring 112. The test head 110 is coupled to and interfaces with the handler 104 using load board 114. The load board 114 is adapted to support packaged integrated circuits under test, and may comprise one or more sockets 116 adapted to support the integrated circuits or devices under test. The handler 104 may include an environmental chamber (not shown) for high and/or low temperature tests, and the handler 104 may also include robotic equipment such as pick and place machines and conveyor belts that are adapted to move IC's from the input station 102 through the handler 104, to the load board sockets 116, to the output station 106.

The input station 102 may include a plurality of input IC trays 118, with each input IC tray 118 being adapted to hold and support a plurality of IC's to be tested. An operator of the test apparatus 100 loads the input IC trays 118 with the IC's, for example, in an array of rows and columns. The input station 102 may include a pneumatic vacuum plunger 122 that is adapted to remove IC's from the input IC tray 118 and place them in the interim tray 124, for example. The input station includes a robotic pick and place mechanism 120 that is adapted to facilitate the movement of the IC's from the input IC tray 118 using the plunger 122.

IC's are transferred using the interim tray 124 into the handler 104 through the input port 126. Inside the handler, the IC's are placed using robotic machinery in the sockets 116 on the load board 114. After the IC's are tested, the robotic equipment moves the IC's back to the interim tray 124 or to another tray located near the output station 106, and the IC's are moved to the output station through the output port 128. The tested IC's are placed using robotic pick and place mechanism 132 and plunger 134 into output IC trays 130.

The test apparatus 100 shown is considered a high cost tester because not only is the apparatus 100 expensive, furthermore, a variety of rather complicated and time-consuming tests are performed on each device under test. The test procedures performed by high cost tester 100 may included detailed functional test of the IC's, and may include AC parameter tests, as examples. For digital signal processors (DSP's), which are complex IC devices, the IC's may have a large number of pins (e.g. 100 to over 500 pin), and require extensive testing. Some tests may require that the IC's be thermally soaked, e.g., brought up to a certain temperature, before certain tests are performed on the IC's. Thermal soaks are time-consuming, and therefore, particularly expensive tests.

Because the high cost test apparatus 108 is very expensive and the time spent testing an IC or set of IC's is very valuable, often, IC's are first screened using a low cost test apparatus before being tested on the high cost test apparatus 108. Some tests may be off-loaded to the low cost tester, to save time on the high cost test apparatus 108.

A prior art low cost test apparatus 200 is shown in FIG. 2. The apparatus 200 is referred to as "low cost" because it is significantly less expensive than a high cost test apparatus 100, e.g., 1/10th of the cost. For example, a low cost test apparatus 200 may cost a few tens of thousands of US dollars.

Low cost test apparatus 200 includes a tester 236 that includes a monitor 238, a control computer 240 which may comprise one or more Sparc station, for example, and a console 242. The tester 236 is coupled by wiring 250 a test head 244. The test head 244 is coupled to a handler 248 via a load board 246. The load board 246 includes a of plurality sockets 252 that are adapted to support and make electrical contact to IC devices under test. An operator of the tester 236 loads the IC devices under test (DUT) into the load board 246, couples the tester to the handler 248, and instructs the tester, using the control computer 240, to perform the low cost tests. Typically, in a low cost test apparatus 200, a plurality of sockets 252 reside on the load board 246, for example, there may be four or eight sockets 252 on a load board 246, so that a set of IC's may be tested with the low cost tests.

The low cost test apparatus 200 may be used to weed out devices that fail preliminary or pre-screening tests. The low cost test apparatus 200 and high cost test apparatus 100 may both be used to test IC's for characterization tests, e.g., to ensure that specified electrical operational parameters are adhered to, and for production testing. The high cost test apparatus 100 and low cost test apparatus 200 are typically located at separate locations, a certain distance apart from one another, for example, on a production line.

Thus, in the prior art, a packaged integrated circuit typically is subjected to two separate test procedures in two separate test apparatuses, a low cost test apparatus 200 and a high cost test apparatus 100. Usually, a low cost test is performed on the packaged IC's, and of the packaged IC's that pass the low cost test, the good integrated circuits are then subjected to a high cost test which involves more stringent testing parameters at extreme temperatures, for example.

A problem with prior art integrated circuit testing is that packaged integrated circuits are loaded into the low cost test apparatus 200 and tested, and then the IC's are unloaded from the low cost test apparatus 200, and subsequently loaded into high cost test apparatus 100. This introduces the chance that the packaged integrated circuits will be damaged, resulting in a loss or reduction in yield. Because the IC's are loaded by hand by an operator, there is a likelihood of human error, and it is possible that bad IC's will be mixed up with good IC's, and vice versa. Furthermore, handling the packaged integrated circuits so often increases the chances that electrostatic discharge (ESD) will cause some of the integrated circuits to have failures, further reducing yields.

Another problem is that most high cost test apparatuses 100 are designed for single IC insertion: e.g., the load board 114 comprises only one socket 116. Thus, IC's are being tested one at a time on the high cost test apparatus 100, which is inefficient, time-consuming, and costly.

What is needed in the art is a more efficient and economical IC test apparatus and method.

What is also needed in the art is a test apparatus and method that avoids having to transfer integrated circuits from one test apparatus to another in order for the required tests to be performed on the integrated circuits.

SUMMARY OF THE INVENTION

Embodiments of the present invention achieve technical advantages as a test apparatus comprising a single handler coupled to at least a first tester and a second tester, when first test procedures from the first tester may be performed on a set of integrated circuits in parallel while second test procedures are being performed by the second tester on a different set of integrated circuits. The IC's are loaded by an operator only once into the apparatus, and all of the required tests are performed on the IC's while in the apparatus.

In one embodiment, disclosed is an apparatus for testing at least one first IC and at least one second IC. The apparatus comprises a first tester adapted to test the at least one first IC with a first test procedure, and a second tester adapted to test the at least one first IC with a second test procedure simultaneously while the first tester tests the at least one second IC with the first test procedure. The first and second test procedures are adapted to test at least some different IC parameters, and the first tester is coupled to the second tester. The apparatus includes a single handler coupled to the first and second testers.

In another embodiment, disclosed is a method of testing at least one first IC and at least one second IC in an apparatus comprising a first tester and a second tester coupled to a single handler, the method comprising coupling the first tester to the second tester, testing the first IC with a first test procedure using the first tester, and testing the second IC with the first test procedure simultaneously while testing the first IC's with a second test procedure using the second tester. In accordance with the method, testing IC's with the first test procedure comprises testing at least some different IC parameters than testing IC's with the second test procedure.

Advantages of embodiments of the present invention include providing the ability to perform all required tests on integrated circuits with a single handler in a single test apparatus, improving integrated circuit yields and being more efficient than prior art IC test methods. Less handling of integrated circuits is required by operators, which decreases the chances for human error and decreases the chances that good IC's will be mixed up with bad IC's, and vice versa. More efficient use is made of the time on high cost testers, and there is less of a chance that integrated circuits will be destroyed or damaged by ESD. In one embodiment of the invention, the first and second testers are coupled to a multiplexer, and a single test head is used, which avoids having to make contact to the integrated circuit more than once, and is particularly advantageous in wafer probe testing.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of preferred embodiments of the present invention will be discussed, followed by a discussion of some advantages of embodiments of the invention.

Figure 1:
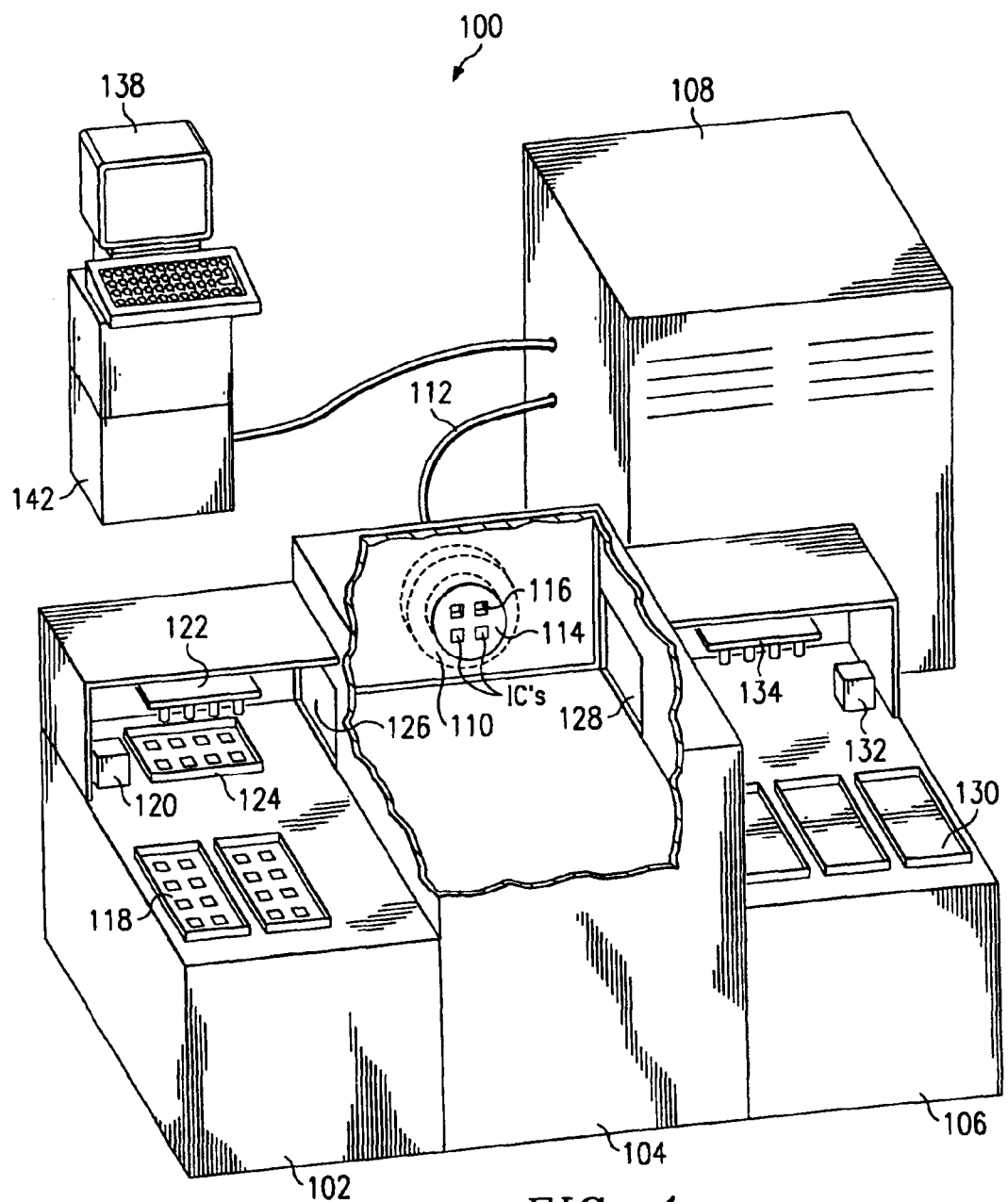
FIG. 1 illustrates a perspective view of a prior art high cost test apparatus for testing integrated circuits.
Figure 2:
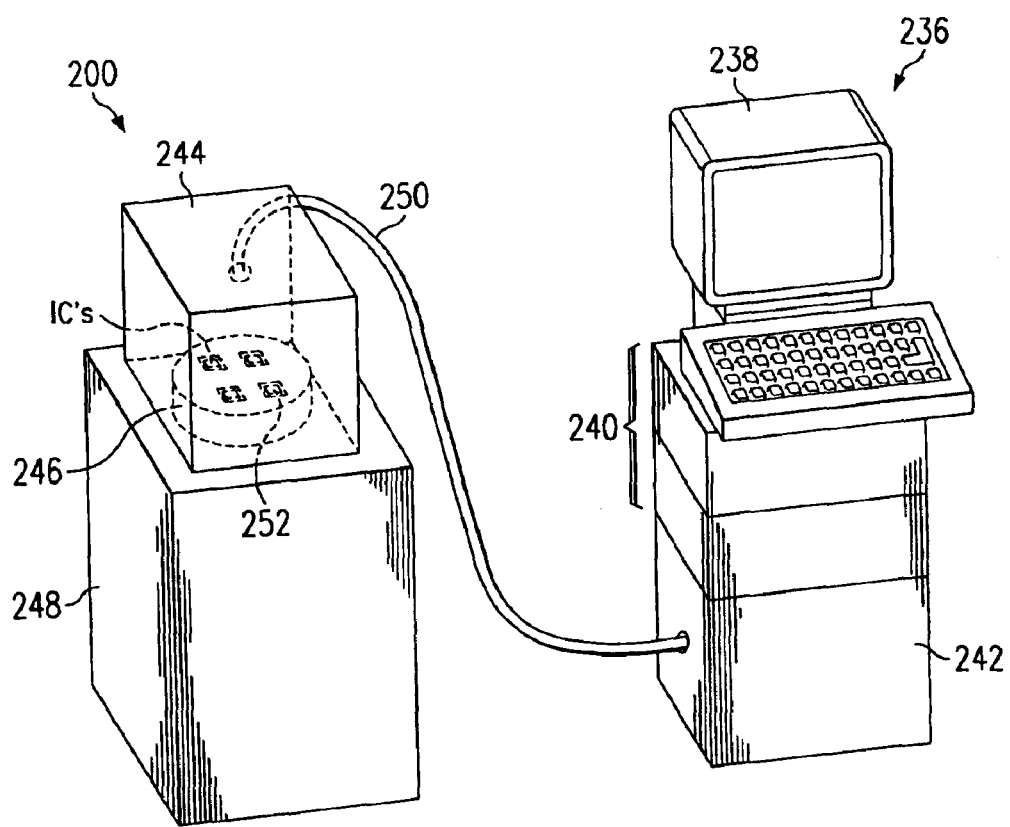
FIG. 2 illustrates a perspective view of a prior art low cost test apparatus for testing integrated circuits.
Figure 3:
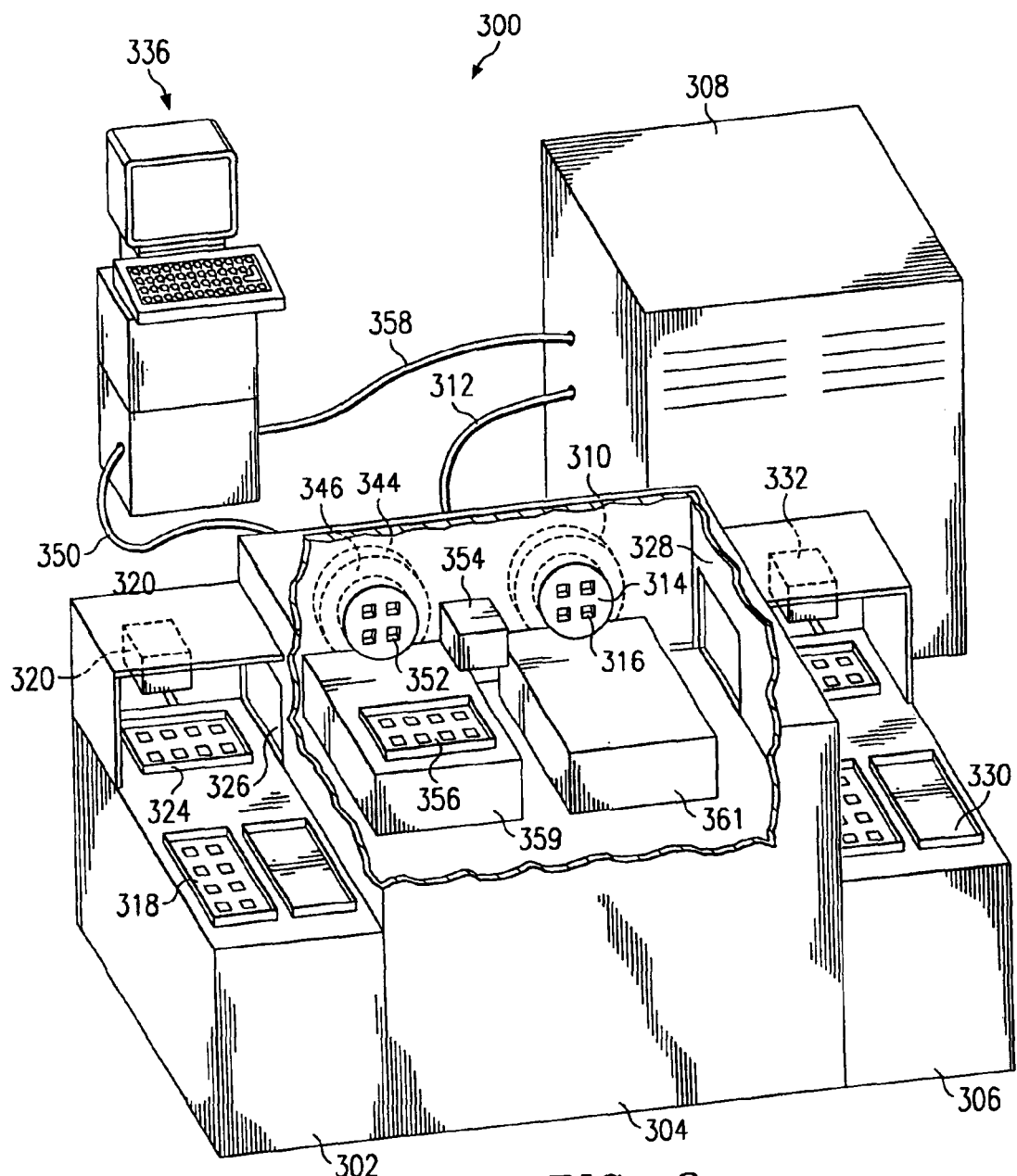
FIG. 3 shows a perspective view of an integrated circuit test apparatus in accordance with an embodiment of the present invention, having a first and second tester coupled to a single handler, wherein a first test procedure is run on a first set of integrated circuits by the first tester simultaneously while a second test procedure is run on a second set of integrated circuits by the second tester.

In FIG. 3, an integrated circuit test apparatus 300 in accordance with an embodiment of the present invention is shown in a perspective view. The test apparatus 300 includes a single handler 304 that is coupled to a first tester 336 and a second tester 308. The coupling of the first tester 336 to the second tester 308 may be by electrical and/or mechanical coupling. Alternatively, the coupling of the first and second testers 336/308 may be an indirect coupling, for example, by a host computer or host network, not shown, that may act as a communication conduit between the first and second testers 336/308. The host computer or network may be adapted to communicate with the first and second testers 336/308 to collect and synchronize data, initiate calibrations, and other operations, for example.

The handler 304 preferably comprises an enclosed space that IC's are disposed within while tests are performed by the first and second testers 336/308. The first tester 336 is adapted to perform a first test procedure on a set of one or more IC's. The second tester 308 is adapted to perform a second test procedure on a set of one or more IC's. In one preferred embodiment, the first tester 336 comprises a low cost tester, and the second tester 308 comprises a high cost tester. The handler 304 comprises an input station 302 and an output station 306, similar to the handler 104 as described for the prior art high cost tester 100 previously herein.

Advantageously, in accordance with embodiments of the present invention, the apparatus 300 includes two or more testers 336/308 coupled to the handler 304. The coupling of the testers 336/308 to the handler 304 may be made by test head 344 and test head 310 which are coupled to the handler 304 via load boards 346 and 314, respectively. Preferably, load board 346 includes one or more sockets 352 adapted to physically and electrically couple a set of integrated circuits under test to the first tester 336 via the first head 344. Also, preferably, load board 314 includes one or more sockets 316 adapted to the electrically couple a set of integrated circuits under test to the second tester 308 via the second test head 310. Preferably, in one embodiment, the number of sockets 352 is greater than or equal to the number of sockets 316. Cables or wiring 350 and 312 may be used to couple the first test head 334 to the first tester 336, and the second test head 310 to the second tester 308, respectively.

The input station 302 includes input trays 318 that are adapted to accommodate and support a plurality of IC's loaded thereon. The input station 302 includes a robotics mechanism 320 that is adapted to move IC's from the input tray 318 and move them into the interim tray 324. The IC's are moved while on the interim tray 324 through the input port 326 of the handler 304 inside the handler 304.

Once the interim tray 324 is inside the handler 304, a mechanism 354 is adapted to move IC's from the interim tray 324 and insert them into the sockets 352 on the first load board 346 for testing. The mechanism 354 may comprise one pick-and-place mechanism, or alternatively, the mechanism 354 may comprise a plurality of pick-and-place mechanisms. The mechanism 354 may comprise a robotic mechanism, gravity-fed mechanism, or other type of IC handler, for example.

After a first set of IC's is tested with first test procedures using the first tester 336, the mechanism 354 is adapted to move the first set of IC's from sockets 352 in the first load board 346, and place them in sockets 316 in the second load board 314. Preferably, simultaneously with the first set of IC's being loaded into the second load board 314 sockets 316, a second set of IC's is loaded into the sockets 352 on the first load board 346. After the first IC's are loaded into the second tester load board 314 and the second set of IC's are loaded into the first tester load board 346, simultaneously, or in other words, in parallel, the first test procedure from the first tester 336 and the second test procedure from the second tester 308 are run on the second IC's and first IC's, respectively.

When the tests are complete, the first IC's are moved through the output port 328 into the output load trays 330 using mechanism 332 at the output station 306. Preferably, simultaneously, the mechanism 354 moves second IC's from the first test tester load board 346 and into the socket 316 of the second tester load board 314.

Mechanism 354 may comprise two separate robotic mechanisms such that a first set of integrated circuits may be loaded from the input port 326 to the first tester load board sockets 352 simultaneously while the second robotic mechanism 354 loads a second set of integrated circuits from the first tester load board sockets 352 to the second tester load board sockets 316.

Depending on the type of first and second test procedures performed by the first and second testers 336/308, the handler 304 may include a first environmental chamber 359 and a second environmental chamber 361, as shown in FIG. 3. The first and second environmental chamber 359/361 are adapted to control the environment of the IC's being tested by the first and second testers 336/308, respectively. For example, the IC's may be exposed to extreme temperatures during electrical tests. Alternatively, no environmental chambers maybe utilized, or only one environmental chamber 359 or 361 may be utilized.

IC test apparatus 300 may comprise a variety of optional features and have a wide range of capabilities. The first and second tester 336/308 first and second test procedures may be adapted to test at least some different IC parameters. This off-loads some of the IC tests from the high cost tester 336 to the low cost tester 308. For example, simpler tests may be performed by the low cost tester 308, while more complicated tests are performed by the high cost tester 336.

Alternatively, a portion of the second test procedure may comprise the same IC tests as at least a portion of the first test procedure. This redundancy ensures that the first and second testers 336/308 are performing tests accurately. The first tester 336 may be coupled to the second tester 308 via wiring or cables 358, such that data may be transmitted from the first tester 336 to the second tester 308, and vice versa.

In one embodiment, the first tester 336 is adapted to calibrate the second tester 308. Alternatively, the second tester 308 may be adapted to calibrate the first tester 336. The first tester 336 may be coupled to the second tester 308, e.g. by wiring or cables 358, and the second tester 308 may be adapted to submit a request for calibration to the first tester 336, and/or the first tester 336 may be adapted to submit a request for calibration to the second tester 308. The first tester 336 may be adapted to calibrate the second tester 308 at predetermined time intervals, and/or the second tester 308 may be adapted to calibrate the first tester 336 at predetermined time intervals. In another embodiment, the first tester 336 may be adapted to calibrate the second tester 308 when ambient temperature has changed by a predetermined amount, and/or the second tester 308 may be adapted to calibrate the first tester 336 when ambient temperature has changed by a predetermined amount.

In an embodiment of the invention wherein the first tester 336 in the apparatus 300 comprises a low cost tester and the second tester 308 comprises a high cost tester, preferably, the first tester 336 first test procedure is completed by the completion of the second tester 308 second test procedure. Preferably, there is no idle time on the high cost tester 308, to achieve maximum efficiency. In one embodiment, the test times for the first tester 336 and the second tester 308 are equal.

While a first set of IC's and a second set of IC's are described herein as being moved through the test apparatus 300 for testing, likewise, a plurality of additional sets of IC's are adapted to be tested in the test flow, in accordance with embodiments of the present invention. For example, the apparatus 300 is adapted to move the second IC's to the second tester 308, simultaneously while moving at least one third IC to the first tester 336 for testing. Second IC's may be tested by the second tester 308 in parallel with third IC's being tested by the first tester 336.

A wide range of tests may be performed in IC's using the apparatus 300. For example, the first test procedure may comprise prescreening tests, and the second test procedure comprises may comprise detailed functional tests. The first and/or second test procedure may comprise static and dynamic current and voltage tests, dynamic functional AC/DC tests, DC offset tests, AC timing relation tests, internal AC parametric tests, power supply current tests, leakage current tests, gain tests, and/or low speed digital pattern tests, as examples. The first and/or second test procedure may comprise external AC parametric tests, signal-to-noise ratio tests, DSP-based AC tests, distortion tests, thermal soaks, RF tests, and/or high speed digital pattern tests with precision timing, as examples.

The IC's tested by the test apparatus 300 may be packaged. IC's packaged with a wide variety of types of IC packages may be tested with the test apparatus described herein, including IC packages such as quad flat packs, ball grid arrays, and pin-grid arrays, as examples. Alternatively, embodiments of the invention may be applicable for IC's on wafer, to be described further here. The apparatus may include a multiplexer adapted to multiplex the first and second test procedures on the first and second IC's.

In one embodiment, the first and second testers 336/308 each comprise low cost testers. In another embodiment, the first and second testers 336/308 both comprise high cost testers. In yet another embodiment, a plurality of testers, e.g., two or more testers, are included in the IC test apparatus for simultaneous, parallel testing of sets of IC's, with one or more of the testers including one or more low cost testers, and with one or more of the testers including one or more high cost testers.

Figure 4:
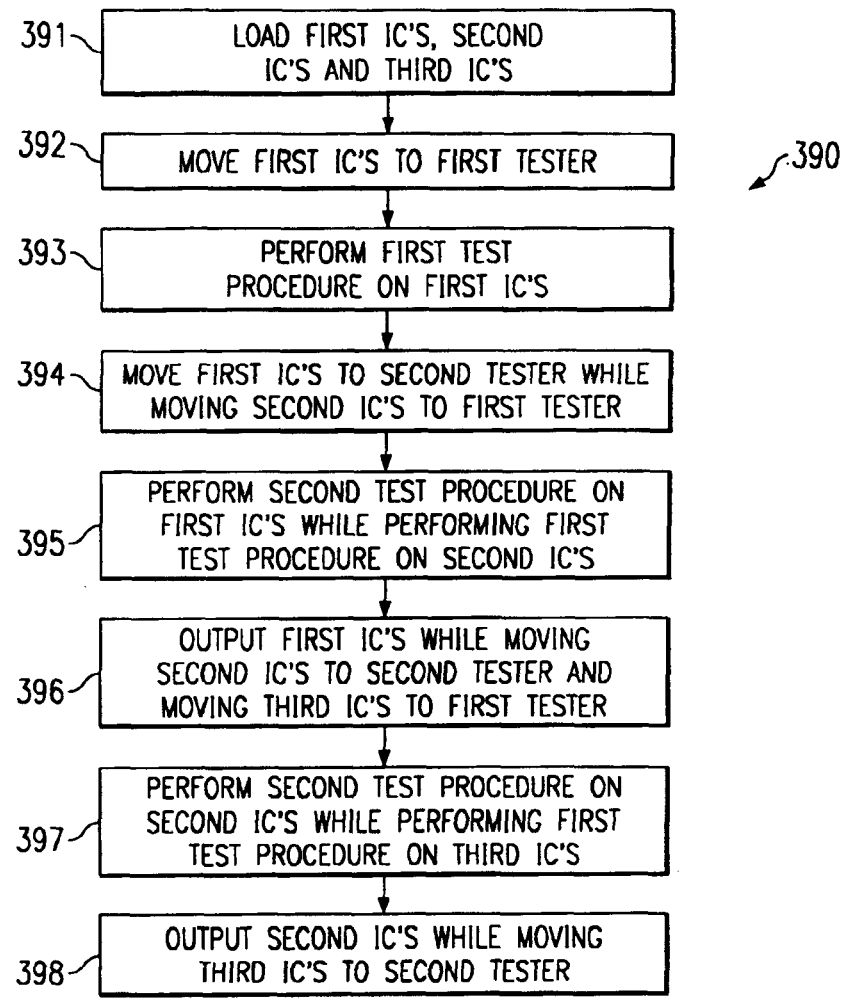
FIG. 4 shows a flow chart for an embodiment for parallel testing of a plurality of sets of integrated circuits with the IC test apparatus shown in FIG. 3.

A flow chart exemplary of the operation of the parallel test apparatus 300 is shown in FIG. 4 at 390. First IC's, second IC's and third IC's are loaded into the input trays 318 (step 391). Preferably, first IC's, second IC's, and third IC's comprise a set of packaged integrated circuits, and each of the first IC's, second IC's, and third IC's may comprise a single IC, or they may comprise a plurality of IC's, e.g. two, four, eight, sixteen IC's within each set.

The first IC's are moved to the first tester (step 392). Preferably, the first IC's are moved into an interim tray 324 by robotics mechanism 320 and the interim tray 324 is moved into the handler 304 through the input board 326. The robotics mechanism 354 of the handler 304 is adapted to move first IC's from the interim tray 324 to the sockets 352 of the first test board. A first test procedure is performed on the first IC's (step 393). In one embodiment, the first test procedure preferably comprises a low cost test and is performed by the first tester 336 using test head 344.

Next, the first IC's may be moved from the first test board sockets 352 to the sockets 316 of the second test board while loading second IC's to the first load board sockets 352 (step 394). This may be accomplished, for example, by the robotic mechanism 354 first moving first IC's 352 to a second interim board 356 within the handler 304 and then moving the IC's to the second load board sockets 316. Alternatively, first IC's 352 may be moved directly from the first load board sockets 352 to the second load board sockets 316. A second test procedure is performed on the first IC's using the second tester 308 simultaneously while performing the first test procedure on the second IC's using the first tester 336 (step 395).

The first IC's may be output from the handler through the output port 328 simultaneously while the second IC's are moved to the second tester load board sockets 316 (step 396). Simultaneously, third IC's may be moved to the first tester load board sockets 352. The second test procedure is performed on the second IC's using the second tester 308 simultaneously while the first procedure is performed on the third IC's using the first tester 336 (step 397).

The second IC's may be output through to the output trays 330 simultaneously while moving the third IC's to the second tester load board sockets 316 (step 398). Many more sets of IC's may be tested in this manner and then loaded to the output trays 330. Each IC is preferably tested with both the first and second test procedure in this manner, sequentially, and in parallel while other IC's are being tested.

In another embodiment, the first IC's are moved to the first tester load board sockets 352, and the second IC's are moved to the second tester load board sockets 316, and the first and second test procedures are performed on the first and second IC's, respectively. Next, the first and second IC's are "swapped", e.g., the first IC's are moved to the second tester load board sockets 316, and the second IC's are moved to the first tester load board sockets 352. The first and second test procedures are then performed on the second and first IC's, respectively.

One goal of embodiments of the present invention is to efficiently use the high cost tester 308. For example, preferably, the high cost tester 308 does not remain idle for long periods of time. In one embodiment, IC's failing the first test procedure are not passed on to have the second test procedure performed on them by the second tester 308. Rather, failed IC's may be placed in interim tray 356 and/or moved through the output port 328 to the output trays 330. For example, in a production application, preferably IC's that fail one or more parameters of the first test procedures are not passed on to be tested by the second tester 308. This avoids wasted time on the high cost tester 308. In another embodiment, such as during characterization testing, both the first and second test procedures are performed on each IC, regardless of the test results.

Embodiments of the invention are beneficial when testing the same number of IC's during both the first and second test procedures with the first and second testers 336/308 simultaneously. However, a further advantage is realized when more IC's are tested in the first tester 336 (low cost) test procedure than are tested in the second tester 308 (high cost) because more of the testing is transferred to the low cost tester 336. In this embodiment, the second handling apparatus 354 used by the high cost tester 308 must be capable of sequencing through the IC's, presenting each IC or set of IC's to the high cost tester 308 until all are tested. This all happens while the IC's are being tested, simultaneously, in parallel, e.g., all at one time, on the low cost tester 336. Preferably, the test time and parallelism is balanced between the first and second test procedures such that the high cost tester 308 is "never" idle, or such that the high cost tester 308 is idle a minimum amount of time.

There are a variety of ways that the test results may be tracked on the various first, second and third IC's as they are tested. For example, each IC may comprise a memory that contains a serial number for each device, often referred to as device ID in the art. The first and second testers 336/308 may use this serial number to store information on each IC tested. Alternatively, the handler 304 may keep positional information regarding each IC tested in memory, which positional information is stored and communicated to an operator, e.g. at the first tester 336.

Also, advantageously, because tests are being performed simultaneously using the first and second testers 336/308, one tester 336/308 may be used to calibrate the other tester 336/308. The apparatus 300 may be set up to periodically calibrate one or the other of the testers 336/308. The ability to cross-calibrate saves the expense of having redundant calibration modules in each tester 336/308.

Figure 5:
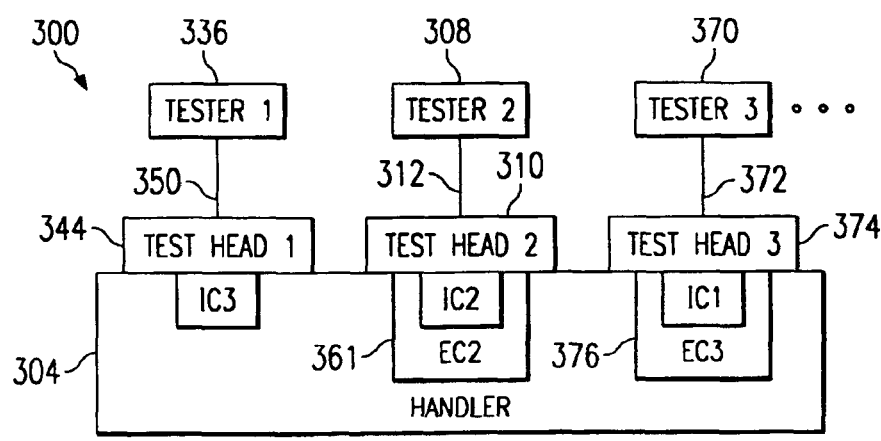
FIG. 5 shows a block diagram of an embodiment of the present invention having three or more testers coupled to a handler, each tester being adapted to run parallel tests on sets of integrated circuits.

A block diagram of another embodiment of the present invention is shown in FIG. 5. In this embodiment, the test apparatus 300 includes a plurality of testers 336/308/370, each being coupled to a single handler 304 via a corresponding test head 340/310/374, respectively. First tester 336 may comprise a low cost tester and the test apparatus 300 may not include an environmental chamber for IC's to be tested by the first tester 336 within the handler 304, for example. Second tester 308 and third tester 370 may comprise high cost testers, and the apparatus 300 may include an environmental chamber 361 for IC's under test by the second tester 308, and/or an environmental chamber 376 for IC's under test by the third tester 370. The environmental chambers 361/376 may be adapted to subject IC's to different environmental tests, e.g. the environment parameters of environmental chamber 361 may be different than the environmental parameters of environmental chamber 376. A plurality of other testers, not shown, maybe included in the test apparatus 300. Sets of IC's maybe tested with test procedures from the first, second and third testers 336/308/370 in parallel, or simultaneously, in accordance with this embodiment of the present invention.

In certain applications, it is desirable to reduce the number of times that contact is made with terminals or bond pads of an integrated circuit. For example, in particular, in wafer probe applications, it is desirable to make physical contact to the die bond pads only once, to avoid damage to the die.

Figure 6:
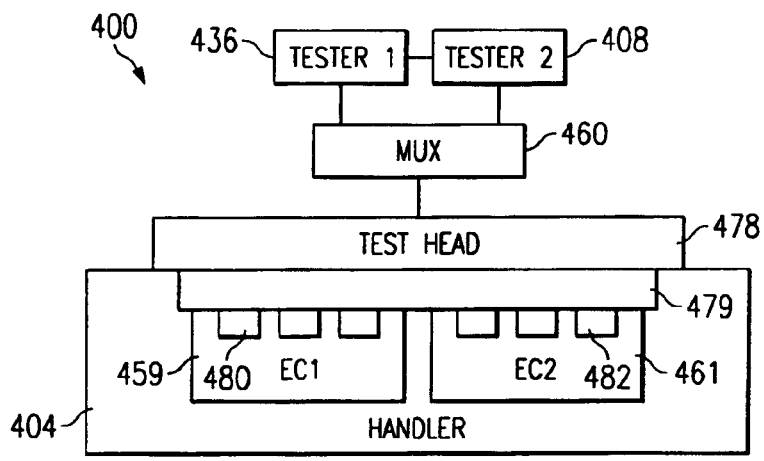
FIG. 6 shows a block diagram of another embodiment of the present invention, wherein a single test head is coupled to the handler, and a plurality of testers are multiplexed to perform parallel testing on sets of integrated circuits.

A block diagram of an embodiment of the invention requiring only one instance of contact to be made to packaged integrated circuits under test is shown in FIG. 6. The test apparatus 400 includes a single handler 404 coupled to a first tester 436 and a second tester 408 via a multiplexer 460. Multiplexer 460 is coupled to the handler 404 via a test head 478, which is coupled to a load board 479. Load board 479 includes first sockets 480 and second sockets 482. First sockets 480 are adapted to receive and support a set of first IC's, and second sockets 482 are adapted to receive and support a set of second IC's. Optional environment chambers 459 and 461 maybe disposed within the handler 404, each environmental chamber 459/461 adapted to subject IC's positioned within first sockets 480 and second sockets 482, respectively, to a range of temperature, pressure, humidity, and other environmental conditions, as examples, while tests on the packaged IC's are performed.

In this embodiment, the first tester 436 and second tester 408 first and second test procedures are multiplexed by the multiplexer 460. For example, first IC's may be loaded into second sockets 482, and second IC's may be loaded into first sockets 480. First test procedures are run on second IC's in first sockets 480 while second test procedures are run on first IC's in second sockets 482. Then, without moving any IC's from the sockets 480/482 they are positioned within, second test procedures may be run on second IC's in first sockets 480 simultaneously while first test procedures are run on first IC's in second sockets 482.

As in other embodiments shown, preferably the first tester 436 is coupled to the second tester 408, so that information from the first and second test procedures can be shared between the two testers 436/408. A plurality of other testers may be coupled to the handler 404 and may be multiplexed by the multiplexer 460 to provide parallel testing of sets of integrated circuits with a plurality of test procedures.

Figure 7:
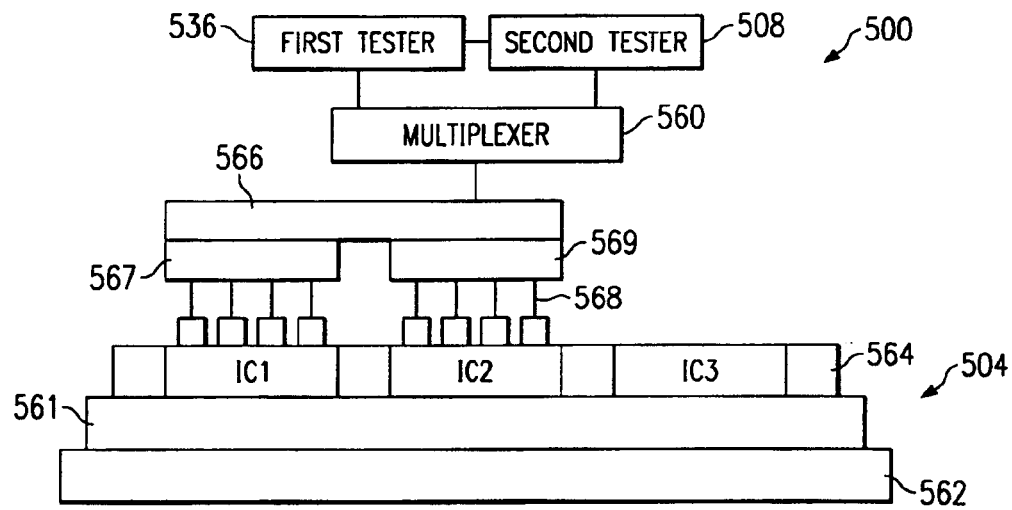
FIG. 7 illustrates a block diagram of an embodiment of the invention implemented for wafer probe testing.

FIG. 7 illustrates a block diagram of an integrated circuit test apparatus 500 adapted to test integrated circuits at the die level while the IC's are still part of a single wafer 564. In this embodiment, advantageously, preferably the IC's, IC1, IC2, and IC3 are contacted only once by the test probes 568. The handler 504 includes a multiplexer 560 that is coupled to the first tester 536 and the second tester 508. The handler 504 may be coupled to the apparatus 566 and 568, the handler 504 being adapted to couple to the IC's, e.g., IC1, IC2, and/or IC3. The test apparatus 500 is particularly useful in wafer probe applications, e.g., the apparatus 566 may comprise a wafer probe card and 568 may comprise pins for contacting IC's directly on the wafer 564 prior to singulation. The test apparatus 500 may include a wafer support 561 in a stepper 562 coupled to the support 561 that is adapted to move the wafer 561 while the probe card 566 stays in place.

In this embodiment, again, the first tester and second tester 436/408 may be used to calibrate one another. Advantageously, the probe pins 468 are only required to contact each integrated circuit e.g. IC1, IC2, once for the testing of the integrated circuit.

In a wafer probe application shown, preferably, sets of die are contacted at once for testing, e.g., 4–16 die at once may be contacted. A diagonal row of die may be contacted at once, to ease the wiring of the test apparatus, for example.

For example, if 8 die are contacted at once in accordance with embodiments of the invention, a first set of four die may be tested using the first test procedure, while a second set of the other four die are tested using the second test procedure, and when the first and second test procedures are completed, then the multiplexer switches the testers, and the first set of four die are tested using the second test procedure, while the second set of four die are tested using the first test procedure.

Figure 8:
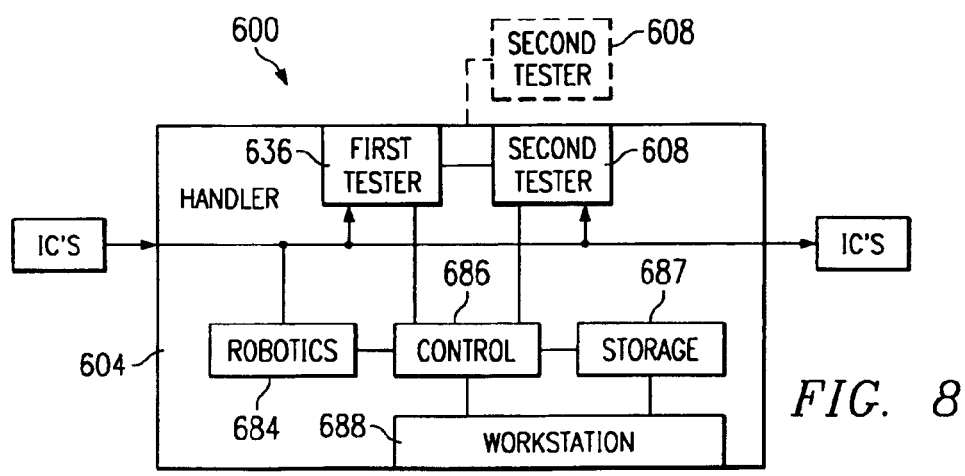
FIG. 8 shows a block diagram of an embodiment of the invention, wherein at least the first tester is integral to the handler.

FIG. 8 shows a block diagram of an embodiment of the present invention, wherein at least the first tester 636 is integral to the handler 604 of the parallel IC test apparatus 600. In one embodiment, first tester 636 may comprise a low cost tester adapted to pre-screen IC's, for example. In this embodiment, the handler 604 includes a pre-screening test function provided by a first tester 636 that is adapted to perform some or all of the low cost tests as performed by prior art low cost testers, for example.

The second tester 608 may either be integral to the handler 604, or separate from the handler 604, as shown in phantom, in accordance with embodiments of the present invention.

The handler 604 is adapted to receive IC's at the handler 604 input, and output IC's at an output. While in the handler, sets of IC's are coupled to first and second testers 636/608, either mechanically via first and second sockets or electrically via a multiplexer into a single insertion into sockets, as described for other embodiments of the invention herein.

The handler 604 may include a workstation 688 for operator interface, as shown. The handler 604 may include control circuitry 686, storage 687, and robotics 684. The control circuitry 686 may be adapted to provide instructions and commands to the various other elements such as robotics 684, first tester 636, second tester 608, as examples. Robotic mechanism 684 may include one or more pick-and-place mechanisms adapted to move IC's and sets of IC's from load trays to the test locations of the IC's. The storage means 687 may comprise a memory element or other storage means adapted to store data collected during the test procedures. The first and second test procedure result information is storable in the storage means with respect to first and second IC position, or alternatively, according to IC identification information.

In another embodiment, the first tester is embedded within and is integral to the second tester. For example, a low cost tester may be integrated into a high cost tester.

Although the robotics mechanism 684, control circuitry 686, storage means 687 and workstation 688 are not shown in every figure herein, e.g., in FIGS. 3, 4, 5, 6, and 7 which depict examples of embodiments of the present invention, these elements may be included in each test apparatus and method 300/390/400/500/600 described herein.

Embodiments of the present invention provide several advantages over prior art IC test apparatuses. All required tests on integrated circuits may be performed on sets of IC's within a single handler in a single test apparatus, improving integrated circuit yields. Sets of IC's are tested sequentially, in parallel, by a plurality of testers within a single handler. Less handling of integrated circuits is required by operators, which decreases the chances for human error and decreases the chances that good IC's will be mixed with bad IC's, and vice versa. More efficient use is made of the time on high cost testers, and there is less of a chance that integrated circuits will be destroyed or damaged by ESD. The first and second testers may be coupled to a multiplexer to allow the use of a single test head, which avoids having to make contact to the integrated circuit more than once. This is particularly advantageous in wafer probe testing. IC test time is reduced, because some tests may be off-loaded from a high cost tester to a low cost tester. The test apparatus and method results in increased throughput of tested IC's.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An apparatus for testing at least one first integrated circuit (IC) and at least one second IC, comprising:
   a first tester adapted to test the at least one first IC with a first test procedure;
   a second tester adapted to test the at least one first IC with a second test procedure simultaneously while the first tester tests the at least one second IC with the first test procedure, wherein the first and second test procedures are adapted to test at least some different IC parameters, wherein the first tester is coupled to the second tester; and
   a single handler coupled to the first and second testers;
   wherein the first tester is adapted to calibrate the second tester.

2. The apparatus according to claim 1, wherein the second tester is adapted to submit a request for calibration to the first tester.

3. The apparatus according to claim 1, wherein the first tester is adapted to calibrate the second tester at predetermined time intervals or when ambient temperatures has changed by a predetermined amount.

4. A method of testing at least one first integrated circuit (IC) and at least one second IC in an apparatus comprising a first tester and a second tester coupled to a single handler, the method comprising:
   coupling the first tester to the second tester;
   testing the first IC with a first test procedure using the first tester; and testing the second IC with the first test procedure simultaneously while testing the first IC's with a second test procedure using the second tester, wherein testing IC's with the first test procedure comprises testing at least some different IC parameters than testing IC's with the second test procedure;
   further comprising calibrating the second tester with the first tester and/or calibrating the first tester with the second tester.

5. The method according to claim 4, wherein the calibrating is in response to a request for calibration from the first or second tester.

6. The method according to claim 4, wherein the first tester is adapted to calibrate the second tester at predetermined time intervals or when ambient temperature has changed by a predetermined amount.

* * * * *